United States Patent [19]

Maeba et al.

[11] Patent Number: 4,816,046

[45] Date of Patent: Mar. 28, 1989

[54] FINE PARTICLE COLLECTOR TRAP FOR VACUUM EVACUATING SYSTEM

[75] Inventors: Yoshiyasu Maeba, Samukawa; Satoru Toyoda, Chigasaki; Humio Naruse, Yokohama, all of Japan

[73] Assignee: Nihon Shinku Gijutsu Kabushiki Kaisha, Chigasaki, Japan

[21] Appl. No.: 182,490

[22] Filed: Apr. 18, 1988

[30] Foreign Application Priority Data

Apr. 22, 1987 [JP] Japan ................................ 62-97521

[51] Int. Cl.$^4$ ............................................ B01D 53/22
[52] U.S. Cl. ........................................ 55/209; 55/269; 204/164
[58] Field of Search ........................... 55/209, 81, 269; 210/176; 204/164

[56] References Cited

U.S. PATENT DOCUMENTS 2,268,134 12/1941 Clusius ................................... 55/209

FOREIGN PATENT DOCUMENTS 682748 8/1979 U.S.S.R. ................................ 55/269

Primary Examiner—Bernard Nozick
Attorney, Agent, or Firm—Brady, O'Boyle & Gates

[57] ABSTRACT

A particle collector trap for a vacuum evacuating system wherein there is provided a vessel formed of a double-wall cylinder and having an inlet conduit connected to a vacuum processing chamber and an outlet conduit connected to at least one vacuum pump, a passage for flowing gas is defined between the double walls of the vessel, and one of the double walls is heated and other wall is cooled so as to maintain a predetermined temperature difference therebetween.

5 Claims, 6 Drawing Sheets

FINE PARTICLE COLLECTOR TRAP FOR VACUUM EVACUATING SYSTEM

FIELD OF THE INVENTION

This invention relates to a fine particle collector trap for a vacuum evacuating system, which is installed between a vacuum processing chamber and a vacuum pump for collecting fine particles such as dusts or the like existing in the vacuum processing chamber before they are carried to the vacuum pump.

BACKGROUND OF THE INVENTION

Heretofore, when the vacuum chamber of an apparatus for forming a thin film on a substrate in which dusts in large quantity may be generated is, for example, evacuated by a vacuum pump, it is known that a mesh member is provided for adhering or collecting the dusts in a gas to be evacuated, the mesh member being interposed in an evacuating passage to protect the vacuum pump from the dusts. It is also known that a drum rotating in oil is provided in the evacuating passage to adhere the dusts in the gas to be evacuated to the surface of the drum or small articles which are contained in the drum.

In an ultrafine particle producing apparatus, produced ultrafine particles are deposited in a collecting chamber to be collected.

When the gas to be evacuated is passed through the mesh member or the drum rotating in oil, Reynolds number is small since the evacuated gas is lower pressure, and the gas flow is laminar. Therefore, the above-mentioned adhesion of fine or ultrafine particles mainly depends on the diffusion effect by the Brownian motion of these particles.

In this case, in order to sufficiently remove the dusts, it is necessary to form the evacuating passage narrow to readily adhere the dusts to the surface of the passage and to flow the evacuated gas while maintaining a required flow rate in the film forming apparatus. As a result, a large pressure difference is required to pass the evacuated gas. However, the pressure difference decreases vacuum suction force of the vacuum pump prevailed in the vacuum processing chamber to cause the pressure of the vacuum processing chamber of the film forming apparatus to disadvantageously increase. A high vacuum pump is required to the vacuum processing chamber so as to avoid this problem. When the evacuating passage has relatively large cross section so as not to considerably increase the pressure difference, there is a problem that it is difficult to sufficiently remove the dusts from the evacuated gas.

As described above, since it is not compatible between to sufficiently remove the dusts and to reduce the pressure difference, it must be comprised at a certain point. As a result, since the necessary pressure difference cannot be considerably reduced, it might be sometimes difficult to install the dust collection unit (trap) between a middle vacuum pump (e.g., Roots vacuum pump). Because, when the trap having large pressure difference is installed between the middle vacuum pump and the vacuum chamber, the pumping of the middle vacuum pump does not effectively operate in the vacuum chamber due to the pressure difference in the trap.

Therefore, due to the face that the pressure difference necessary to pass the gas through the dust collector cannot be sufficiently reduced, there arises a difficulty that high vacuum condition cannot be obtained without deteriorating the performance of the vacuum pump used in the vacuum evacuating system of the film forming apparatus. Further, when oil is used to remove the dusts, there is also a problem that oil component may flow into the vacuum chamber to adversely influence the film forming apparatus.

With the ultrafine particle producing apparatus, the produced ultrafine particles are intaken together with the evacuated gas by the vacuum pump to cause defects to deteriorate the efficiency for collecting these particles.

It is, therefore, an object of this invention to solve the drawbacks of the above-mentioned conventional apparatuses and to provide a fine particle collector trap for a vacuum evacuating system which can effectively collect fine particles such as dusts or the like in low pressure gas without raising the pressure difference between a vacuum processing chamber and the evacuating system.

Another object of the invention is to provide a fine particle collector trap for a vacuum evacuating system which makes it possible to use a vacuum pump obtaining relatively high vacuum with ready manufacture and provide easy maintenance.

A further object of the invention is to provide a fine particle collector trap for a vacuum evacuating system which may be utilized for collecting ultrafine particles produced in an ultrafine particle producing apparatus.

SUMMARY OF THE INVENTION

According to this invention, there is provided a fine particle collector trap for a vacuum evacuating system comprising a vessel formed of a double-wall cylinder and having an inlet conduit connected to a vacuum processing chamber in which a processing is performed and an outlet conduit connected to at least one vacuum pump, a space between the double walls of said double-wall cylinder defining a passage for flowing gas, one of the double walls being a high temperature wall and the other being a low temperature wall.

Preferably, the double-wall cylinder has so a length as to decrease the pressure difference between the vacuum chamber and the vacuum pump which is necessary to pass the evacuated gas through the space and to collect all fine particles prevailed in the gas.

One of the double walls of the double wall cylinder may be formed of the outer wall of the vessel which is provided with means for heating said one wall, and the other wall may be formed of an inner cylinder disposed substantially at the center of the outer wall which is provided with means for cooling the other wall. It is prefer that the flow passage has larger cross section than that of the inlet conduit.

The inlet conduit may be connected, for example, to the vacuum chamber of the film forming apparatus, and the outlet conduit may be connected to the vacuum pump for low or middle vacuum evacuation. When the vacuum pump is operated, gas prevailed in the vacuum chamber is intaken through the passage in the collecting vessel to the vacuum pump, and fine particles such as dusts in the gas intaken by the vacuum pump move at a certain velocity by thermophoretic forces from the high temperature side to the low temperature side in the passage of the collecting vessel to be adhered to the low temperature wall. Since the fine particles have the same moving velocity at the lower temperature gradient, the smaller the pressure becomes, the fine particles in the gas can be sufficiently attracted to the low temperature wall even when the space between the low temperature wall and the high temperature wall is increased to reduce the temperature gradient, i.e., when the cross section of the flow passage is increased.

Further, when the cross section of the collecting passage is larger than that of the inlet conduit the pressure difference required to collect the fine particles may be small, so that a vacuum pump of relatively high vacuum type may be used, thereby rapidly reducing the pressure in the vacuum chamber.

In order that this invention may be more clearly understood, it will now be disclosed in greater detail with reference to the accompanying drawings:

DETAILED DESCRIPTION

Figure 1:
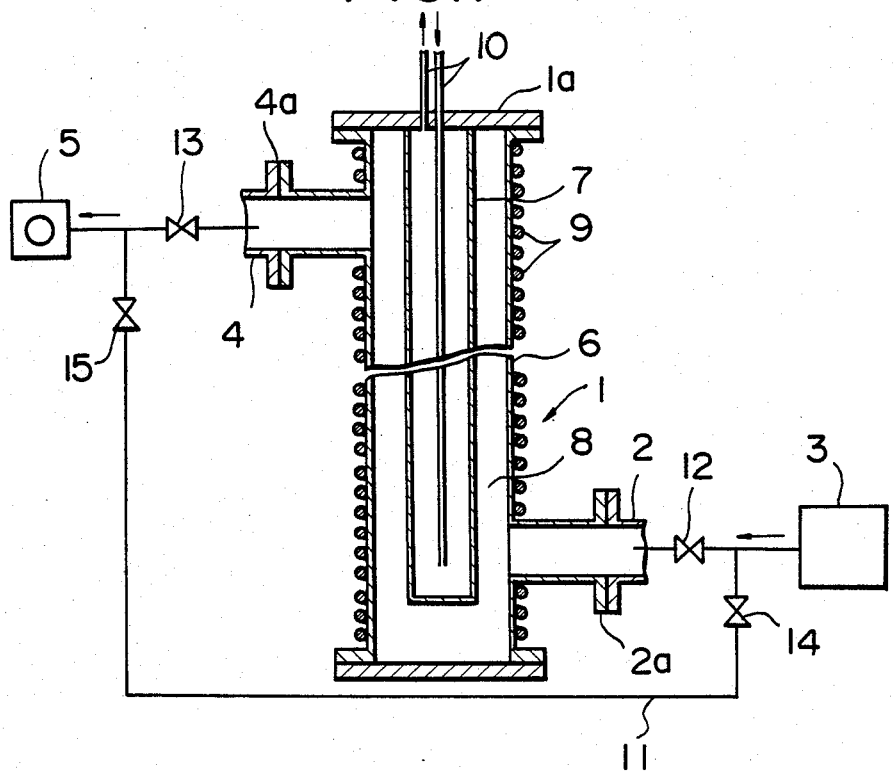
FIG. 1 is a longitudinal sectional view showing the essential portion of a fine particle collector trap for a vacuum evacuating system according to this invention.

Reference is now made to FIGS. 1 of the drawings wherein an embodiment of this invention is illustrated.

In FIG. 1, reference numeral 1 designates a vessel made of a double-wall cylinder which is provided with an inlet conduit 2 connected to a vacuum chamber 3 of an apparatus for forming a film on a substate not shown or the like and an outlet conduit 4 connected to a vacuum pump 5 such as a Roots vacuum pump. The vessel 1 is formed of an outer wall cylinder 6 and an inner wall cylinder 7, and a passage 8 is formed between the cylinders 6 and 7. The passage 8 is hermetically connected through vacuum flanges 2a and 4a to the inlet conduit 2 and the outlet conduit 4, respectively, and has a cross section larger than that of the inlet conduit 2.

A heater 9 is wound on the outer surface of the outer wall cylinder 6 the temperature of which may be controlled by means of a thermocouple, not shown. Cooling water is fed in and out through cooling water pipes 10 and 10 which are provided through the cover 1a of the vessel 1 in the inner wall cylinder 7 for inflowing and outflowing the cooling water to hold the cylinder 7 at low temperature.

In FIG. 1, reference numeral 11 denotes a bypass for interconnecting the vacuum pump 5 and the vacuum chamber 3 by bypass the double-wall cylinder vessel 1, numerals 12 and 13 depict valves provided in both the inlet conduit 2 and the outlet conduit 4, respectively, and numerals 14 and 15 valves provided in the bypass 11.

The operation of the illustrated fine particle trap will be described.

When the vacuum pump 5 is operated in the state that the valves 14 and 15 of the bypass 11 are closed, gas is fed from the vacuum chamber 3 connected with the inlet conduit 2 through the inlet conduit 2 and the passage 8 in the double-wall vessel 1 to the outlet conduit 4 to be intaken into the vacuum pump 5. Since the passage 8 is defined beween the high temperature outer cylinder 6, for example, at 120° C. and the low temperature inner cylinder 7, for example, at 20° C., a temperature gradient occurs perpendicularly across the cylinders 6 and 7 in the gas flowing through the passage 8. Thus, fine particles in the gas are moved from the high temperature outer cylinder side to low temperature inner cylinder side at a certain velocity by the thermophoretic force and are adhered to the wall surface of the low temperature inner cylinder 7. In this case, the lower the pressure in the passage 8 becomes, the moving velocities of the fine particles become the same even at a small temperature gradient. Accordingly, the space between the high temperature outer cylinder 6 and the low temperature inner cylinder 7 can be increased to certain extent so as to collect the fine particles from the gas flowing under low pressure. Further, since the radius of the inner cylinder 7 can be taken freely, the cross section of the passage 8 can be increased almost arbitrarily as compared with the inlet conduit 2.

Therefore, according to the illustrated embodiment, the pressure difference necessary to allow the gas to flow through the passage 8 may be sufficiently reduced. Thus, not only the vacuum pump for low vacuum but also the vacuum pump for obtaining relatively high vacuum can be used. Further, since the performances of these vacuum pumps can be sufficiently utilized, the vacuum chamber 3 can be evacuated to relatively high vacuum.

In case the vacuum pump 5 is frequently operated and stopped, the valves 12 and 13 in the inlet and outlet conduits 2 and 4 are closed, the valves 14 and 15 in the bypass conduit 11 are so opened to bypass the gas therethrough, and then it can be avoided that the fine particles collected in the vacuum chamber 1 are whirled up by the pressure variation occurred due to the energizing and deenergizing of the vacuum pump 5 and are fed out from the vacuum chamber 1.

Furthermore, the fine particles adhered to the walls of the low temperature inner cylinder 7 in the vessel 1 can be easily removed by dismounting the inner cylinder 7.

It should be understood that the size of the collecting vessel 1 may be selected depending upon the gas flow rate to be passed.

Figure 2:
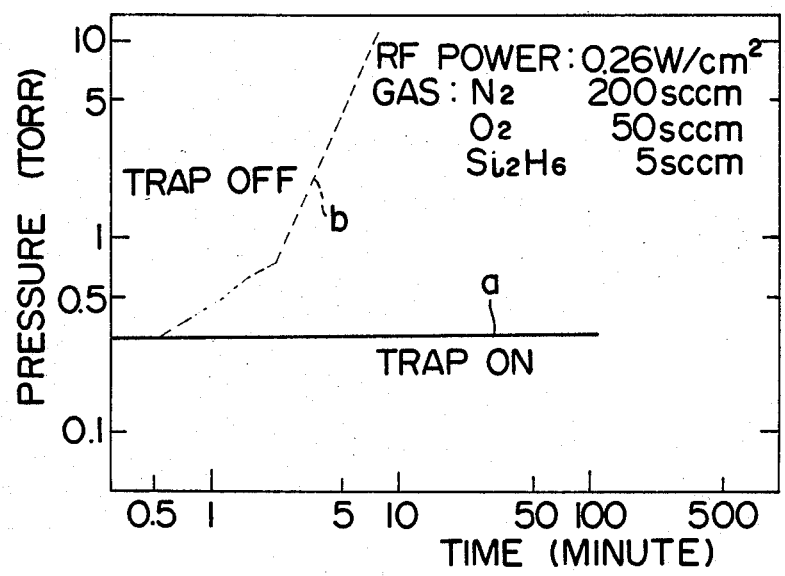
FIG. 2 is a graph showing the characteristics of the illustrated trap.

FIG. 2 shows the measured results when the apparatus in FIG. 1 is applied to a plasma CVD apparatus in which 200 SCCM (cc/min at standard atmospheric pressure) of $N_2$, 50 SCCM of $O_2$, 5 SCCM of $Si_2H_6$ are fed under 0.3 Torr in the film forming apparatus.

In this case, the temperature of the high temperature outer wall cylinder is 110° C. and the temperature of the low temperature inner wall cylinder is 10° C. FIG. 2 indicates the pressure (Torr) in the film forming apparatus at an ordinate axis and the time (min.) at an abscissa axis. A solid line (a) in FIG. 2 indicates the case that the trap is operated, and a broken line ( b ) indicates that the trap is not operated.

As indicated by the broken line ( b ), in the state that the trap is not operated, the vacuum pump 5 is clogged due to reactive products (SiO$_2$) to cause it not to evacuate gas in approx. 10 min. so that the pressure roses up to 10 Torr. However, when the trap is operated, no variation in the pressure occurs as designated by the solid line ( a ), and no clogging occurs in the vacuum pump.

When the trap was disassembled after the experiments have been finished, it was confirmed that the fine particles were trapped in a large wuantity to the inner wall cylinder 7 ( to be cooled ).

Figure 3:
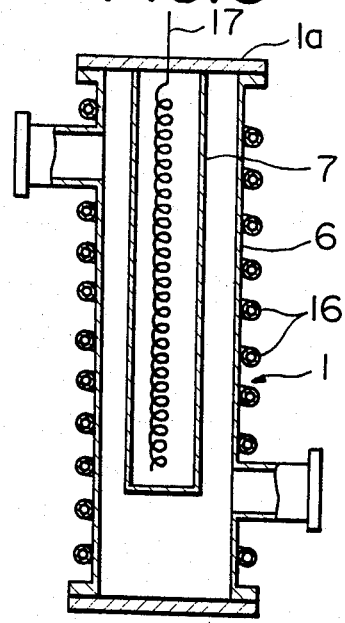
FIG. 3 is a longitudinal sectional view showing another embodiment according to this invention.

FIG. 3 shows another embodiment of this invention, wherein the same reference numerals as those in FIG. 1 designate the same or equivalent components.

This embodiment is different from the first embodiment shown in FIG. 1 in that a cooling water pipe 16 is provided on the outside of the outer cylinder 6 of the double-wall cylinder vessel 1 and a heater 17 is disposed in the inner wall cylinder 7.

According to the embodiment shown in FIG. 3, when the vacuum pump is operated, fine particles in the vessel 1 are moved by thermophoretic forces from the inner cylinder 7 held at high temperature toward the inner surface of the outer cylinder 6 held at low temperature to be adhered to the inner wall of the outer cylinder 6. After the operationis stopped, the fine particles adhered to the inner wall of the outer cylinder 6 held at low temperature are removed by removing the cover 1a and the inner cylinder 7, and then cleaning the inner wall surface.

In the embodiments described above, the case that the trap of this invention was used in the film forming apparatus has been illustrated. However, when this inventionis applied to an ultrafine particle producing apparatus, the inlet conduit 2 may be connected to a vacuum chamber for producing ultrafine particles and the outlet conduit 4 may be connected to a suitable vacuum pump.

Heating means for the high temperature wall may be of any suitable type, e.g., a block type heater may be provided on or buried in the high temperature wall. A heat insulating material is attached externally to the high temperature side to prevent the heat from being dissipated.

On the other hand, cooling means of the low temperature wall may also be of any suitable type. A cooling water pipe may be provided as in the second embodiment instead of the jacket type in the first embodiment. The low temperature wall is not cooled with water, but may be maintained at room temperature. In this case, the temperature of the high temperature wall may be controlled to hold the temperature difference between the high and low temperature walls at a predetermined range.

Applying this invention to an apparatus which uses gas not dangerous even if it is condensed, the high temperature side is maintained at room temperature and the low temperarure side may be cooled with liquid nitrogen.

The double-wall cylinder of the vessel in this inventionis most preferably in a cylindrical shape, but may be formed in a polygonal cylinder.

Figure 4:
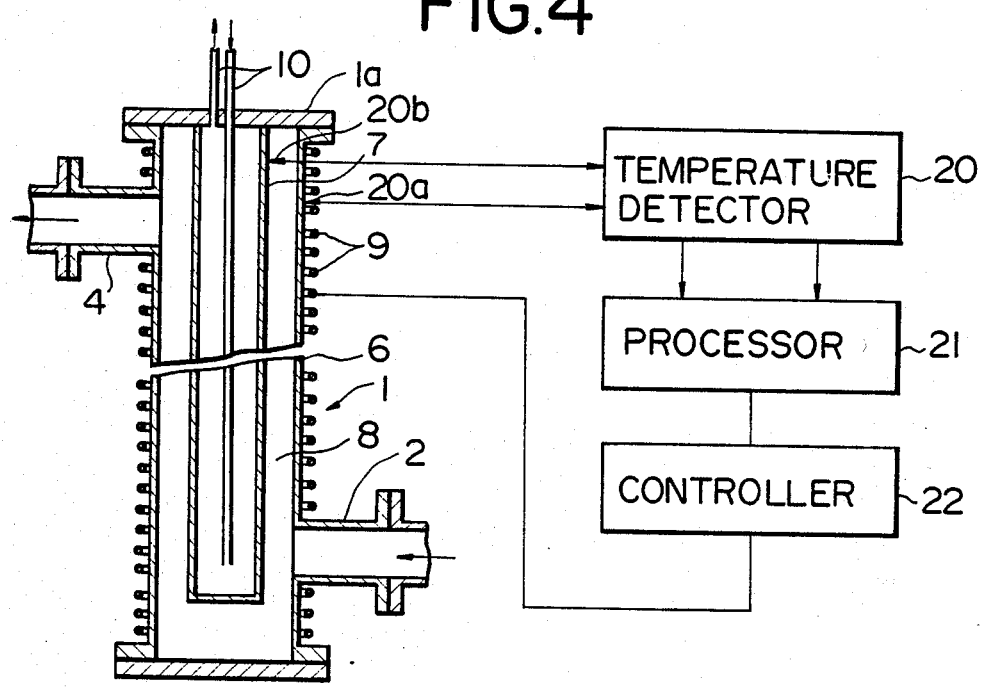
FIG. 4 is a longitudinal sectional view showing a modification of the embodiment of FIG. 1.

In FIG. 4, there is shown a further embodiment of this invention, wherein the same reference numerals as those in FIG. 1 designate the same or equivalent components.

Reference numeral 20 denotes a temperature detector for detecting the temperatures of both the cylinders 6 and 7, which is connected to thermocouples 20a and 20b separately attached to the walls of the cylinders 6 and 7, and the temperature values of both the walls detected by the thermocouples 20a and 20b are fed to a processor 21.

The processor 21 calculates the temperature difference based on the measured temperature values from the detector 20 and thus compares it with a predetermined temperature difference between the high temperature wall and the low temperature wall which is necessary to obtain predetermined performance ( temperature gradient X distance between the walls ) by calculation or experiments. Then the processor 21 produces an output signal which is proportional to the difference between the predetermined temperature difference and the obtained temperature difference and is fed to a power controller 22 for controlling the power supply to the heater 9. The power controller 22 is intended to control the power supply to the heater 9 so that both the temperature differences become equal to each other.

The power controller 22 may employ any known controller, such as an ON/OFF controller, a proportional controller or a PID controller.

The controlling sequence of the units will be described by way of an example.

For example, in order to obtain a predetermined performance by the fine particle trap described above, it is assumed that the temperature difference between the high and low temperature walls needs 100° C. In other words, temperature gradient X distance between the walls is equal to 100° C.

Thus, if the temperature of the cooling water is 20° C., the high temperature wall must be heated to 120° C.

Heretofore, this is mere setting, but in this embodiment, it operates as below:

(A) The preset temperature difference 100° C. is inputted and stored into the processor 21.

(B) Then, the temperatures of the high and low temperature walls are measured by the thermocouples 20a and 20b and inputted to the temperature detector 20.

(C) The temperature difference between both the inputted temperature values is calculated by the processor 21.

(D) When the calculated temperature difference is larger than the preset temperature difference in the above paragraph (A), the power supply to the heater 9 is stopped by the power source controller 22, but when the difference is smaller, the power is supplied or increased.

(E) Assume that the trap is operated at 120° C. and 20° C. and the low temperature wall rises to 30° C. due to a defect such as an interruption of coolant. In this case, the temperature difference becomes 90° C. Therefore, the power source controller 22 outputs continuously a signal for executing the energizing of the heater 9 until the high temperature wall becomes 130° C. so that the temperature difference becomes 100° C.

(F) In this manner, the trap exhibits predetermined performance by setting the high temperature wall at 130° C. and the low temperature wall at 30° C.

Figure 5:
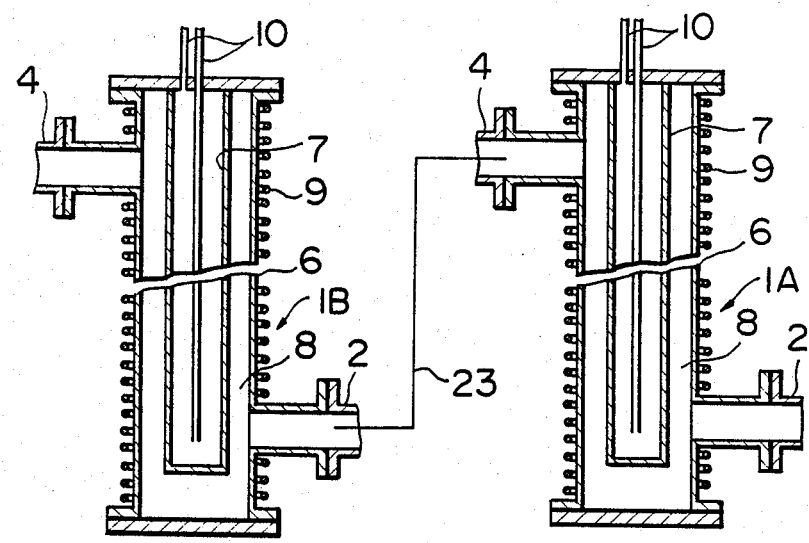
FIG. 5 is a longitudinal sectional view showing a further embodiment of this invention.

FIG. 5 schematically shows a further embodiment of this invention in which two vessels 1A and 1B are connected in series for improving a particle trapping function. In the illustrated embodiment, the same reference numerals as those in FIG. 1 designate the same or equivalent components.

The outlet conduit 4 of the front-stage vessel 1A is connected to the inlet conduit 2 of the rear-stage vessel 1B through a conduit 23.

Figure 6:
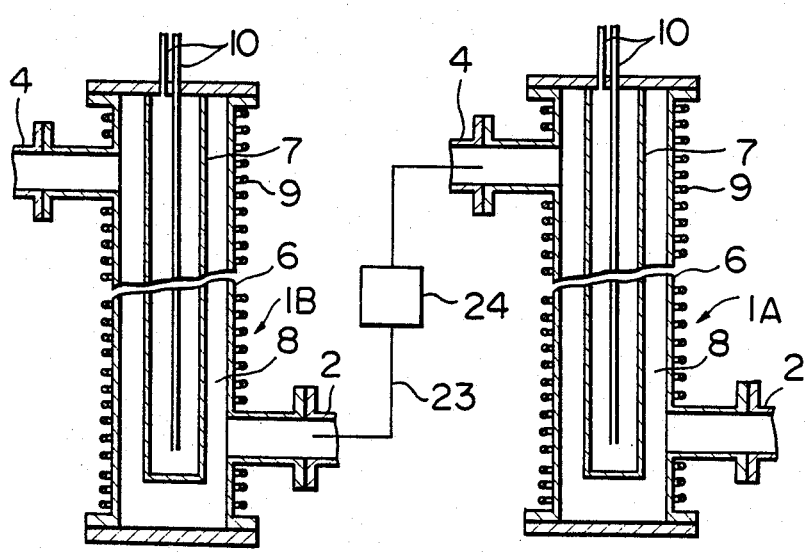
FIG. 6 is a longitudinal sectional view showing a further embodiment of this invention.

FIG. 6 schematically shows a modification of the embodiment in FIG. 5. It is appreciated that this embodiment is different from the embodiment of FIG. 5 in that a discharging mechanism 24 is provided on the conduit 23 for connecting the outlet conduit 4 of the front-stage vessel 1A to the inlet conduit 2 of the rear-stage vessel 1B.

The discharging mechanism 24 may be constructed in different forms as shown in FIGS. 7 to 12.

Figure 7:
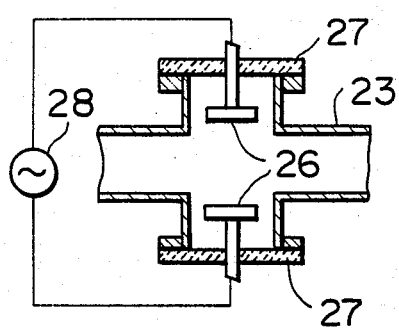
FIGS. 7 to 11 are sectional views respectively showing different embodiments of a discharging mechanism in the apparatus of FIG. 6.

In the arrangement of FIG. 7, two electrodes 26 and 26 are opposed through insulating flanges 27 to the conduit 23 which interconnects both the front and rear stages of the traps. An AC high voltage (including high frequency) is applied by an AC power source 28 to both the electrodes 26 and 26 to produce a discharge therebetween, thereby generating a plasma. It should be understood that instead of the AC power source 28 a high voltage DC power source may be used to produce a DC discharge between the electrodes 26 and 26.

According to this embodiment, the plasma is generated by the discharge between the electrodes 26 and 26 to accelerate the reaction of unrected gas.

Figure 8:
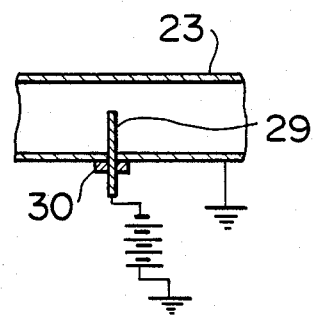

In the arrangement of FIG. 8, a cathode 29 is inserted through an insulator 30 into the conduit 23 which interconnects both the front and rear stages of the traps to generate a plasma between the cathode 29 and the conduit 23 set to zero potential.

Figure 9:
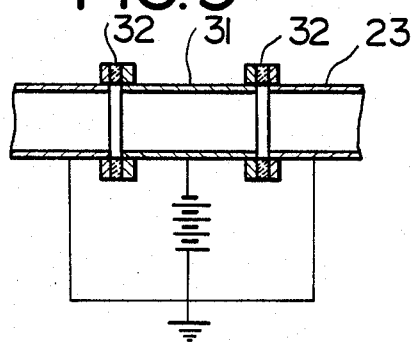

In the arrangement of FIG. 9, there is provided a conduit 31 which is insulated through insulating flanges 32 and 32 and interposed in the conduit 23, and a high negative voltage is applied to the insulated conduit 31 to produce a discharge between it and the conduit 23 set to zero potential.

Figure 10:
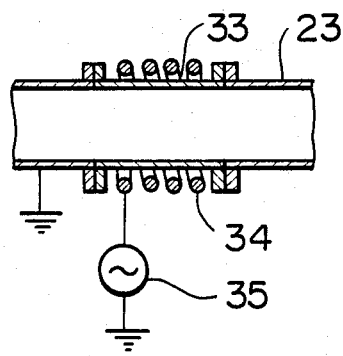

In FIG. 10, a portion 33 of the conduit 23 interconnected both the front and rear stages is composed of a dielectric material, a high frequency coil 34 is wound on the outside of the conduit portion 33, and a high frequency voltage is applied by a high frequency power source 35 to the coil 34 to generate a potential gradient due to an electric field in the space, thereby producing a discharge therebetween without electrode.

Figure 11:
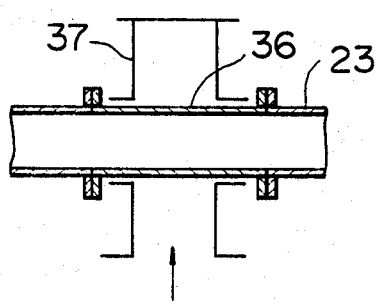
Figure 12:
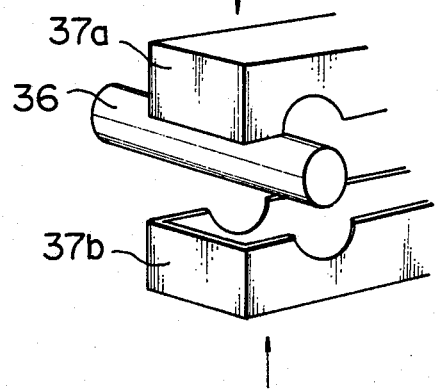
FIG. 12 is a perspective view showing a further embodiment of the discharging mechanism in FIG. 6.

In the arrangement shown in FIG. 11, a part 36 of the conduit 23 connected between the front and rear stages is composed of a dielectric material (e.g., a quartz glass conduit), a microwave cavity resonator (in which the interior surrounded by a conductor forms a microwave resonance space) 37 is so provided as to surround the conduit portion 36 to produce a discharge in the conduit by means of microwave in the resonator 37. As shown in FIG. 12, the resonator 37 is assembled by inserting the conduit portion 36 between two cavity resonator boxes 37a and 37b made of normal conductor and engaging these resonator boxes in a direction of an arrow. A discharge with microwave may be produced in the conduit portion 36 inserted into the resonator boxes 37a and 37b.

In the arrangement shown in FIG. 6, most particles contained in the evacuated gas which flows through the vessel 1A of the front stage trap are mostly adhered to the wall surface of the inner cylinder 7 by thermophoresis, but unreacted gas component contained in the evacuated gas can pass through the front stage vessel 1A. The unreacted gas component is reacted to be particulated by the discharging mechanism 24 during passing through the conduit 23 which connects the outlet conduit 4 of the vessel 1A to the inlet conduit 2 of the rear stage trap. The particulated gas component is adhered to the wall surface of the cylinder 7 by thermophoresis thereby collecting or trapping it together with the fine particles not collected by the front stage vessel 1A.

In this manner, the unreacted gas component can be extremely reduced, and most particles can be collected. Accordingly, any clogging of the vacuum pump can be avoided and the life of the pump oil can be remarkably increased.

Figure 13:
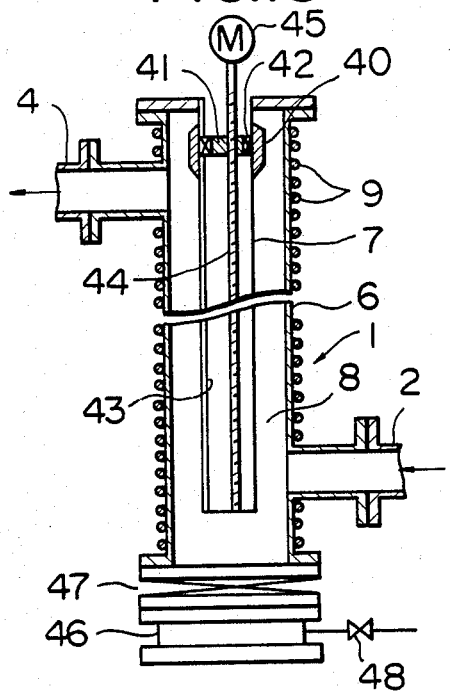
FIG. 13 is a sectional view showing a further embodiment of this invention.

FIG. 13 schematically shows a further embodiment of this inventionin which a cleaning mechanism is provided and the same reference numerals as those in FIGS. 1, 4, 5 and 6 designate the same or equivalent components.

In FIG. 13, the heater 9 is provided on the outer wall cylinder 6 of the vessel 1, and the inner wall cylinder 7 is held at low temperature in such a manner that a coolnat is contained therein, only its upper portion being opened with the environment.

A ring shaped element 40 made of a magnet or a magnetic material is fitted elevationally movably on the outer wall surface of the cylinder 7. A solid cylinder 41 in which a magnet 42 is buried in the peripheral surface is inserted movably only axially into the cylinder 7. The solid cylinder 41 is provided with a groove, not shown, on the peripheral surface for preventing it from being rotated which is engaged with a projection 43 formed axially on the inner surface of the cylinder 7. The magnet 42 is magnetically coupling the solid cyolinder 41 and the ring shaped element 40. The solid cylinder 41 is also provided with a thread at the inner surface, and is engaged with a threaded rod 44 which is driven by a reversible motor 45 mounted on the upper portion. Thus, the solid cylinder 41 can be moved only in the elevational directions along the inner surface of the cylinder 7 by the rotation of the rod 44 which is driven by the motor 45.

On the other hand, a dust reservoir 46 is removably disposed via a gate valve 47 on the bottom of the vessel 1. The dust reservoir 46 communicates with environment through a leakage valve 48.

Then, the operation of the cleaning mechanism will now be described.

(A) The gate valve 47 in the bottom of the vessel 1 is opened.

(B) The motor 45 is energized to move down the scraping mechanism 40 previously held at the upper end of the cylinder 7 as shown in FIG. 13 by means of the downward movement of the solid cylinder 41 caused by the rotation of the rod 44, thereby scraping off the dusts or particles of large quantity adhered to the outer wall surface of the cylinder 7 into the lower dust reservoir 46. At this time, the leakage valve 48 is closed.

(C) After the dusts adhered to the wall of the cylinder 7 are all scraped off to finish the cleaning, the gate valve 47 is closed.

(D) The leakage valve 48 is opened to introduce the atmospheric air into the dust reservoir 46 to set it to the atmospheric pressure, the dust reservoir 46 is then removed to take the dusts accumulated therein.

As described above, the cleaning can be simply performed without disassembling the collector or returning it to the atmospheric pressure. According to the embodiment described above, the cleaning can be easily performed in a short time. Thus, no provision of a spare collector (trap) is required.

Figure 14:
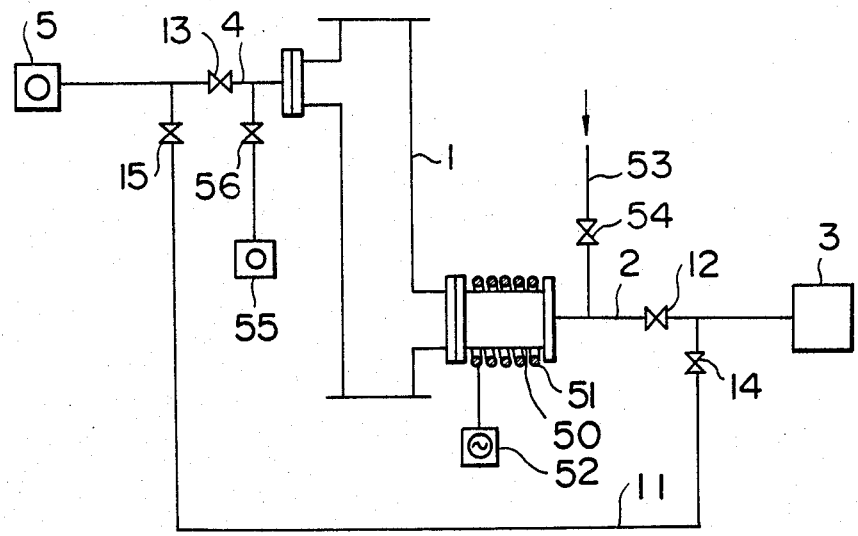
FIG. 14 is a sectional view showing a further embodiment of this invention.

FIG. 14 diagrammatically shows the using state of a fine particle collector trap according to a further embodiment of this invention, wherein the same reference numerals as those in FIG. 1 designate the same or equivalent components.

In FIG. 14, reference numeral 1 designates a vessel for a thermophoresis type fine particle trap, in which high and low temperature walls, not shown, are opposed, and the fine particles in gas are moved from the high temperature wall to the low temperature wall by means of thermophoresis and are to be adhered to the low temperature wall.

A discharge tube 50 made of a dielectric material is mounted on the inlet conduit 2 of the vessel 1, and a coil 51 is provided on the outside of the discharge tube 50 and connected to a high frequency power source 52.

A cleaning gas inlet conduit 53 is connected to the inlet conduit 2 which is connected to the inlet side of the discharge tube 50, and a valve 54 is provided in the inlet conduit 53. Cleaning gas fed through the inlet conduit 53 may use, for example, $CF_4$ in a system for cleaning fine particles (powder) such as $SiO_2$. Further, fluorine gas such as $SF_6$, $C_2F_6$, $C_3F_8$ may be used.

On the other hand, a vacuum pump 55 is provided for recovering the cleaning gas and is connected through a valve 56 to the beforehand side (upstream side) of the valve 13 for a main line on the outlet conduit 4.

The illustrated fine particle trap will be operated as follows:

When the fine particles such as dusts generated in a film forming process, for example CVD are adhered in a number of layers on the low temperature wall surface of the trap vessel 1 to be necessary to clean them, the valves 12 and 13 of the main line are closed, and the valves 14 and 15 of the bypass 11 are opened to continue vacuum evacuating.

Simultaneously, in case that the valve 54 of the cleaning gas inlet conduit 53 is opened and the cleaning gas, for example $CF_4$ is introduced through the inlet conduit 53, the $CF_4$ is activated in a plasma which is produced in the discharge tube 50 by applying a high frequency wave thereto. Thus, the $CF_4$ is chemically reacted with the $SiO_2$ adhered to the low temperature wall so that $SiF_4$ is evaporated in gas state, and then is recovered by the vacuum pump 55 through the opened cleaning gas exhaust valve 56 and removed to be cleaned by the trap.

When the cleaning operation is finished in this way, the valves 14 and 15 of the bypass 11 are closed, the valves 12 and 13 of the main line are opened, and the main line of the ordinary trap is again reset for a subsequent trapping action.

According to this embodiment, the cleaning can be carried out without disassembling the trap so that a danger can be avoided and the operating efficiency may be improved.

Figure 15:
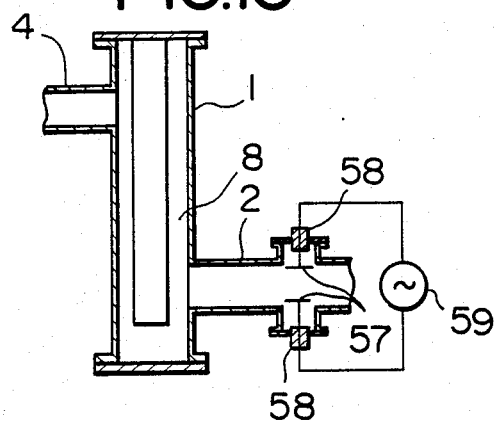
FIGS. 15 to 17 are sectional views respectively showing different embodiments of a discharging mechanism in the apparatus of FIG. 14.
Figure 16:
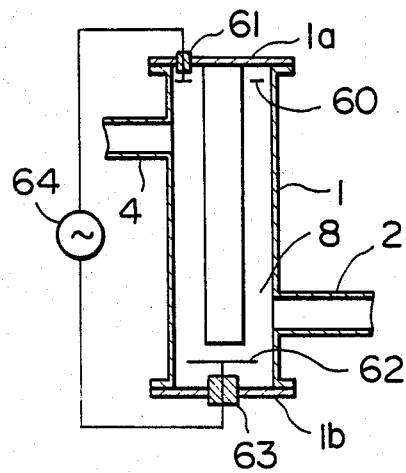
Figure 17:
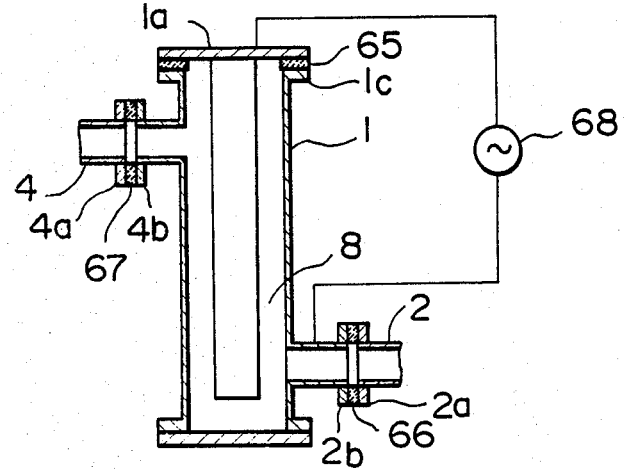

FIGS. 15 to 17 schematically show essential portions of another embodiments of the discharging mechanism.

In FIG. 15 there is shown an arrangement in which two electrodes 57 and 57 are opposed through an insulating material 58 on the inlet conduit 2, a high voltage is applied by a high frequency power source 59 to both the electrodes 57 and 57 for producing a discharge therebetween, thereby generating a plasma. Instead of the high frequency power source 59 a high voltage DC power source may be used for executing a DC discharge.

In the illustrated embodiment, the plasma is generated by the discharge between both the electrodes to activate the cleaning gas.

FIG. 16 shows an arrangement that a ring shaped electrode 60 is provided via an insulator 61 on an upper cover 1a of the trap vessel 1, and disk-like electrode 62 is provided via an insulator 63 on a lower cover 1b. A high voltage is applied by a high frequency power source 64 to both the electrodes 60 and 62 to produce a discharge between the electrodes, thereby generating a plasma therebetween.

FIG. 17 shows an arrangement that the upper cover 1a of the trap vessel 1 is attached via an insulator 65 to a flange 1c of the vessel body, and the flanges 2a and 4a of the inlet and outlet conduits 2 and 4 are attached via insulators 66 and 67 to flanges 2b and 4b of the vessel body. A high frequency power source 68 is connected via conductors to the upper cover 1 and the portion of the inlet conduit 2 on the body side to produce a discharge directly between the upper cover 1a of the vessel 1 and the inlet conduit, thereby generating a plasma.

In the embodiments shown in FIGS. 16 and 17, since the plasma is generated directly within the vessel 1, both the activation of cleaning gas and the chemical reaction of the particles adhered to the low temperature wall are performed in the vessel. Therefore, these embodiments have such an advantage that the reactive product gasification can be accelerated.

According to this invention as described above, the vessel having the inlet conduit connected to the vacuum chamber and the outlet conduit connected to the vacuum pump is composed of the double-wall cylinder which is provided with the high and low temperature walls, and the passage is formed between both the walls. Thus, the following advantages may be obtained.

(i) The fine particles in the gas fed through the inlet conduit are adhered to the low temperature wall to be efficiently collected.

(ii) since pressure difference for collecting the fine particles is not substantially generated, the vacuum pump which can produce relatively high vacuum can be employed to increase the vacuum in the vacuum chamber without deteriorating the performance of the vacuum pump.

(iii) Since the fine particles can be collected in a dry type without using oil, the vacuum chamber is not oilily contaminated.

(iv) Since the vessel is simply composed of the double-wall cylinder, the manufacture is easy, inexpensive and simple in maintenance.

The embodiments of this invention described herein are for purposes of illustration and the scope of this invention is intended to be limited only by the following claims.

What is claimed is:

1. A fine particle collector trap for a vacuum evacuating system comprising a vessel formed of a double-wall cylinder and having an inlet conduit connected to a vacuum processing chamber in which a processing is performed and an outlet conduit connected to at least one vacuum pump, a space between the double walls of said double-wall cylinder defining a passage for flowing gas, one of the double walls being a high temperature wall and the other being a low temperature wall.

2. A fine particle collector trap as claimed in claim 1, wherein said double-wall cylinder has so a length as to decrease the pressure difference between said vacuum chamber and said vacuum pump which is necessary to pass the evacuated gas through the space and to collect all fine particles prevailed in the gas.

3. A fine particle collector trap as claimed in claim 1, wherein said one of the double walls of said double-wall cylinder is formed of the outer wall of said vessel which is provided with means for heating said one wall, and the other wall is formed of an inner cylinder disposed substantially at the center of said outer wall which is provided with means for cooling said other wall.

4. A fine particle collector trap as claimed in claim 1, wherein said one of the double walls of said double-wall cylinder is formed of the outer wall of said vessel which is provided with means for cooling said one wall, and the other wall is formed of an inner cylinder disposed substantially at the center of said outer wall which is provided with means for heating said other wall.

5. A fine particle collector trap as claimed in any one of claims 1 to 4, wherein said flow passage has larger cross section than that of said inlet conduit.

* * * * *